(12) United States Patent
Yamada et al.

(10) Patent No.: US 8,542,534 B2
(45) Date of Patent: Sep. 24, 2013

(54) SELECT GATE PROGRAMMING IN A MEMORY DEVICE

(75) Inventors: Shigekazu Yamada, Tokyo (JP); Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 584 days.

(21) Appl. No.: 12/756,366

(22) Filed: Apr. 8, 2010

(65) Prior Publication Data

US 2011/0249503 A1    Oct. 13, 2011

(51) Int. Cl.
*G11C 11/34* (2006.01)

(52) U.S. Cl.
USPC .................................................. 365/185.19

(58) Field of Classification Search
USPC .................................................. 365/185.19
See application file for complete search history.

(56) References Cited

U.S. PATENT DOCUMENTS

| | | | |
|---|---|---|---|
| 7,239,550 B2 * | 7/2007 | Pabustan et al. | 365/185.17 |
| 7,286,406 B2 * | 10/2007 | Lutze et al. | 365/185.18 |
| 7,511,996 B2 * | 3/2009 | Kim | 365/185.02 |
| 8,335,108 B2 * | 12/2012 | Lee et al. | 365/185.17 |
| 2009/0011560 A1 * | 1/2009 | Aritome | 438/257 |
| 2009/0180330 A1 * | 7/2009 | VanBuskirk et al. | 365/185.24 |
| 2010/0195397 A1 * | 8/2010 | Hemink | 365/185.17 |
| 2011/0134701 A1 * | 6/2011 | Moschiano et al. | 365/185.19 |

* cited by examiner

*Primary Examiner* — Hoai V Ho
*Assistant Examiner* — Pablo Huerta
(74) *Attorney, Agent, or Firm* — Leffert Jay & Polglaze, P.A.

(57) ABSTRACT

Methods for programming select gates, memory devices, and memory systems are disclosed. In one such method for programming, a program inhibit voltage is transferred from a source line to unselected bit lines. Bit line-to-bit line capacitance, between the unselected bit lines and selected bit lines to be program inhibited, boosts the bit line voltage of the selected, inhibited bit lines to a target inhibit voltage. In one embodiment, the voltage on the selected, inhibited bit line can be increased in a plurality of inhibit steps whereby either one, two, or all of the steps can be used during the programming of unprogrammed select gates.

33 Claims, 10 Drawing Sheets

SELECT GATE PROGRAMMING IN A MEMORY DEVICE

TECHNICAL FIELD

The present embodiments relate generally to memory and a particular embodiment relates to select gate programming in a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A flash memory is a type of memory that can be erased and reprogrammed in blocks instead of one byte at a time. A typical flash memory comprises a memory array that includes a large number of memory cells. Changes in threshold voltage of the memory cells, through programming of charge storage nodes (e.g., floating gates or charge traps) or other physical phenomena (e.g., phase change or polarization), determine the data value of each cell. The cells are typically grouped into blocks. Each of the cells within a block can be electrically programmed, such as by charging the charge storage node. The data in a cell of this type is determined by the presence or absence of the charge in the charge storage node. The charge can be removed from the charge storage node by an erase operation.

Figure 1:
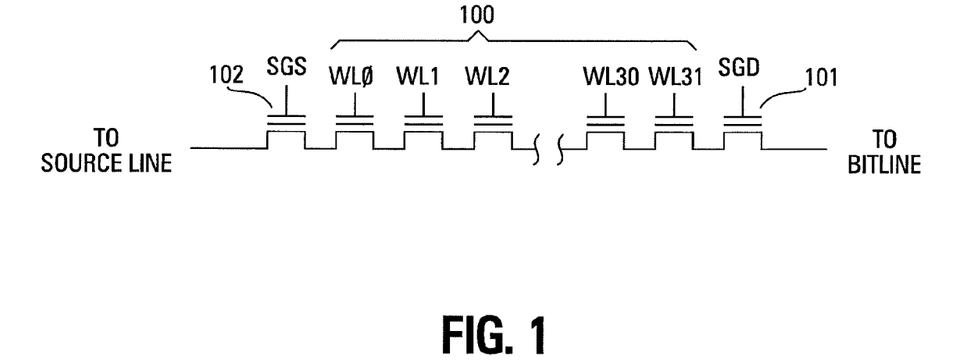
FIG. 1 shows a typical prior art series string of memory cells using select gate drain and select gate source transistors.

In a NAND architecture memory device, the memory blocks can be organized as series strings of memory cells, such as illustrated in FIG. 1. Each series string can be comprised of a number of flash memory cells 100 (e.g., 32) coupled serially drain-to-source between a select gate drain (SGD) transistor 101 and a select gate source (SGS) transistor 102.

The SGD/SGS transistors 101, 102 can be formed of the same type of transistors as the flash memory cells 100. Since the SGD/SGS transistors 101, 102 initially behave the same as the flash memory cells 100, the SGD/SGS transistors 101, 102 can be programmed and erased as well. Thus, prior to initial use of the memory device, the SGD/SGS transistors 101, 102 should be programmed to a particular threshold voltage to enable proper operation of each series string of memory cells. The transistors 101, 102 can subsequently be turned on whenever that threshold voltage is applied to the transistor's control gate.

The control gates of the SGD transistors 101 are common across all of the series strings of a memory block. Similarly, the control gates of the SGS transistors 102 are common across all of the series strings the memory block. Thus, a programming voltage applied to an SGD control gate of one series string of memory cells is also applied to the remaining SGD control gates of other series strings in the same memory block. This is also true of the SGS transistors.

Once a particular SGD/SGS transistor has been programmed and has passed program verify, that particular transistor should be program inhibited. The program inhibit prevents over-programming of the programmed SGD/SGS transistor from additional programming pulses applied to other SGD/SGS transistors, of the same memory block, that have not yet passed program verify.

For the reasons stated above, and for other reasons stated below that will become apparent to those skilled in the art upon reading and understanding the present specification, there is a need in the art for a way to inhibit select gate transistors during a programming operation.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Subsequently described embodiments of a method for programming can be used on both select gate drain (SGD) transistors and select gate source (SGS) transistors. FIGS. 2-6 illustrate one embodiment of a method for programming an SGD transistor in at least one series string of memory cells while inhibiting one or more SGD transistor in other series strings of memory cells. The method for programming SGS transistors, as illustrated in the timing diagram of FIG. 7 and discussed subsequently, is similar to the SGD embodiment but the inhibit sequence is changed in that the access lines (e.g., word lines) and SGS control gates are biased with higher voltages. The higher voltages transfer the inhibit voltage through the series string to the SGS transistor more efficiently than the lower SGD inhibit voltages. Prior to programming, the initial states of the SGD/SGS transistors, in the illustrated embodiments, are assumed to be unknown.

FIGS. 2-5 illustrate substantially the same circuit with each figure showing the different biasing used for each step of inhibiting programming of an SGD transistor of one data line (e.g., bit line) and programming of an SGD transistor of another bit line. For purposes of clarity, only two bit line circuits are shown. The present embodiments would typically program an entire memory block, or other grouping of memory cells, substantially simultaneously.

Figure 2:
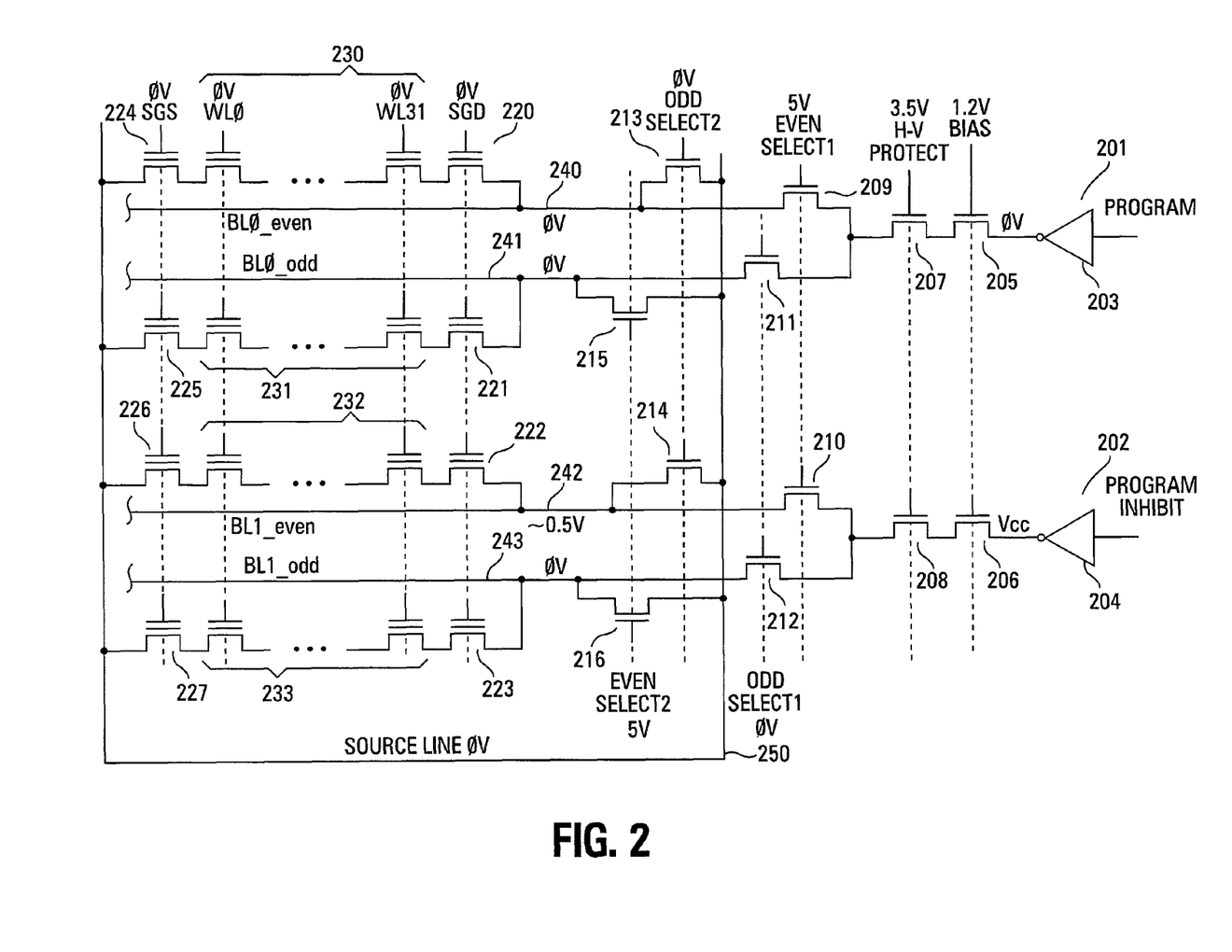
FIG. 2 shows a schematic diagram of one embodiment of an inhibit step of a method for programming select gate drain transistors.

Referring to FIG. 2, the circuit is comprised of two bit line circuits 201, 202. One circuit 201 is to be exposed to further programming while the other circuit 202 is to be inhibited from further programming.

Each bit line circuit 201, 202 is further comprised of a bit line driver 203, 204 that provides the current for the odd/even pair of series strings of memory cells. A BIAS transistor 205, 206 is used to determine the target bit line voltage. The bit line voltage is determined by the BIAS control gate voltage minus the threshold voltage for the BIAS transistor 205, 206. For example, as illustrated in FIGS. 2-5, the common control gate of the BIAS transistors 205, 206 is at 1.2V. If it is assumed that $V_{th}$ of the transistors 205, 206 is approximately 0.7V then the bit line is biased at 1.2V-0.7V or approximately 0.5V. Thus, the target bit line voltage can be changed by changing the BIAS transistor 205, 206 voltage.

HV PROTECT transistors 207, 208 provide high voltage protection of their respective bit line circuit 201, 202. During the erase of a flash or other non-volatile memory device, the bit line voltage might go up to approximately 20V. The HV PROTECT transistors 207, 208 protect periphery circuits from high voltage.

Each bit line circuit is further comprised of the odd and even bit lines 240-243 that are coupled to their respective series string of memory cells through an SGD transistor 220-223. For example, bit line 0 is comprised of BL0_even 240 and BL0_odd 241. Bit line 1 is comprised of BL1_even 242 and BL1_odd 243.

Only the even page (e.g., even bit lines) of the memory block or other grouping of memory cells is selected for programming in the illustrated embodiments. The odd page (e.g., odd bit lines) is unselected and is thus always program inhibited during the programming of the even page. Since the even page is selected, bit lines belonging to the even-page must be decoded and either programmed or inhibited. The present disclosure does not discuss programming of the odd page but it follows substantially the same programming method as the even page except that the odd bit lines are selected.

Access to each individual bit line 240-243 for reading and writing data is further controlled by EVEN SELECT1 transistors 209, 210, EVEN SELECT2 transistors 215, 216, ODD SELECT1 transistors 211, 212, and ODD SELECT2 transistors 213, 214. Four different series strings of memory cells 230-233 are illustrated. As will be discussed subsequently, the EVEN SELECT2 and ODD SELECT2 transistors 213-216 are biasing transistors for their respective bit lines, as determined by the voltage on the source line 250 and whether a particular ODD/EVEN SELECT2 transistor 213-216 is turned on.

Connection of the drain side of the series strings 230-233 to their respective bit line 240-243 is controlled by SGD transistors 220-223. Connection of the source side of these series strings 230-233 to the source line 250 is controlled by SGS transistors 224-227.

As illustrated by the dotted lines, the control gates of the BIAS, HV PROTECT, first and second even/odd select, SGD/ SGS transistors, and the memory cells are common to the memory block or other grouping of memory cells being programmed. Thus, a program voltage applied to, for example, a first SGD transistor 220 is also applied to all of the SGD transistors that have a common control gate with the first SGD transistor 220.

Figure 3:
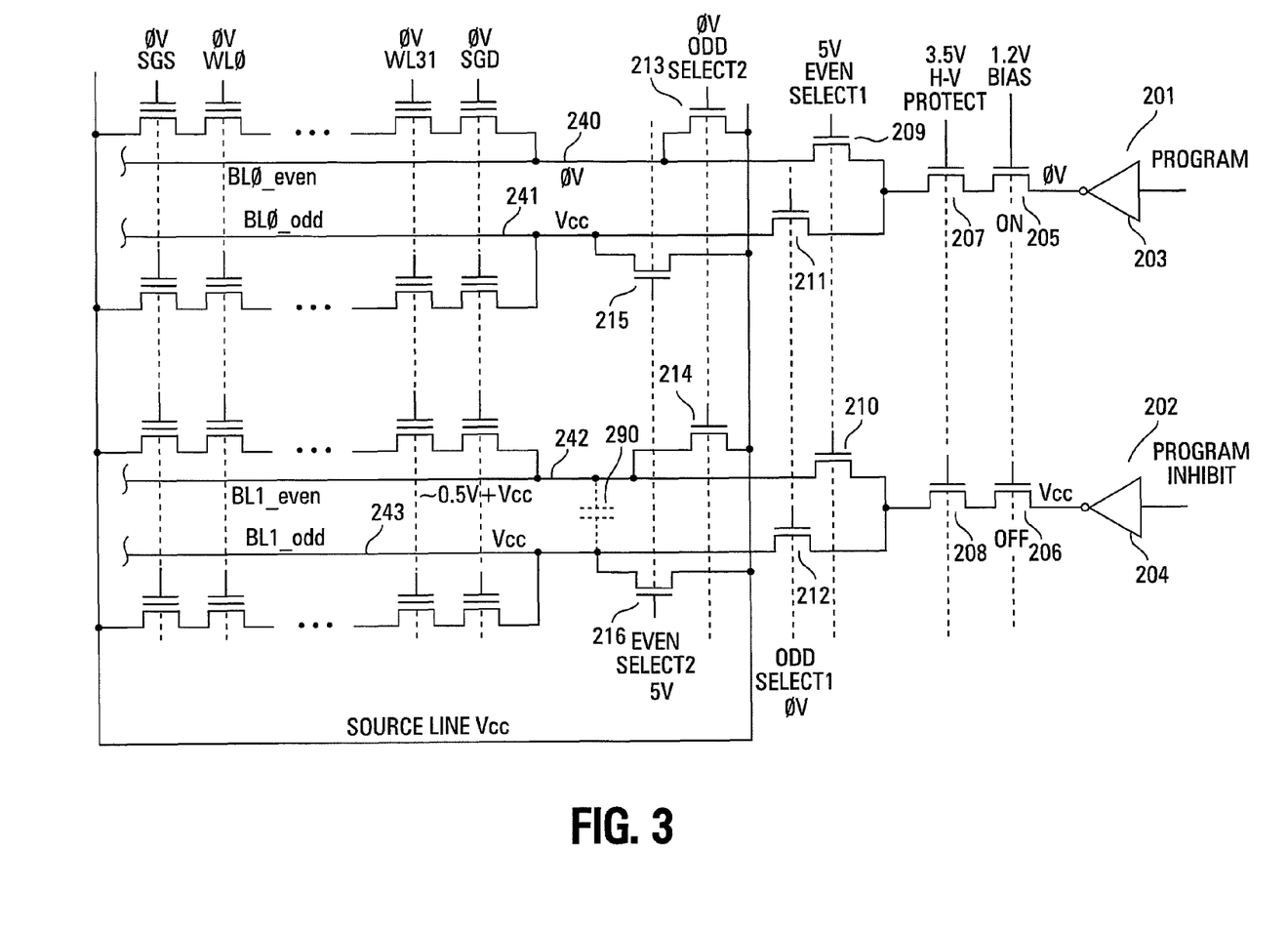
FIG. 3 shows a schematic diagram of one embodiment of another inhibit step of the method for programming select gate drain transistors.
Figure 4:
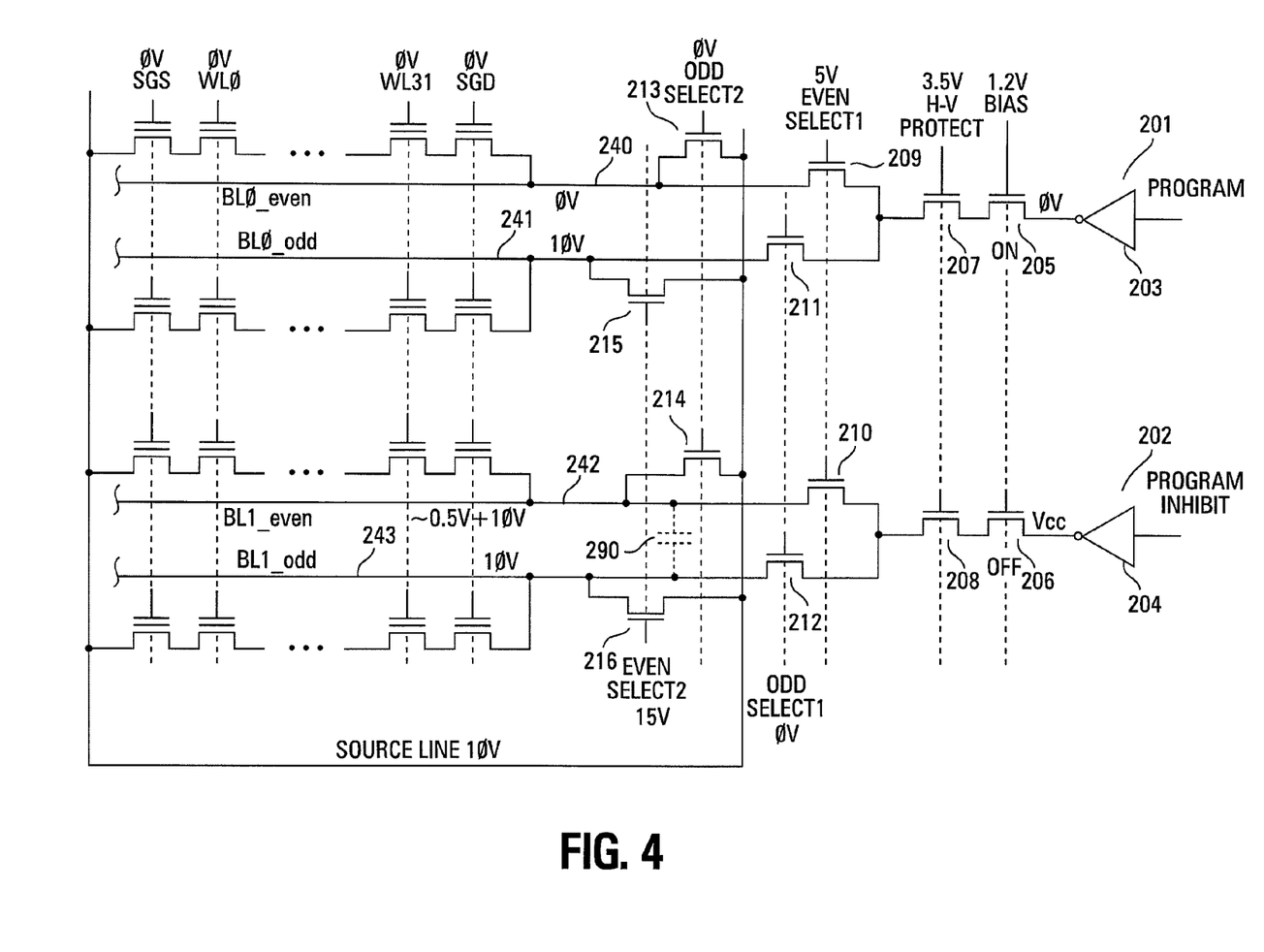
FIG. 4 shows a schematic diagram of one embodiment of another inhibit step of the method for programming select gate drain transistors.
Figure 5:
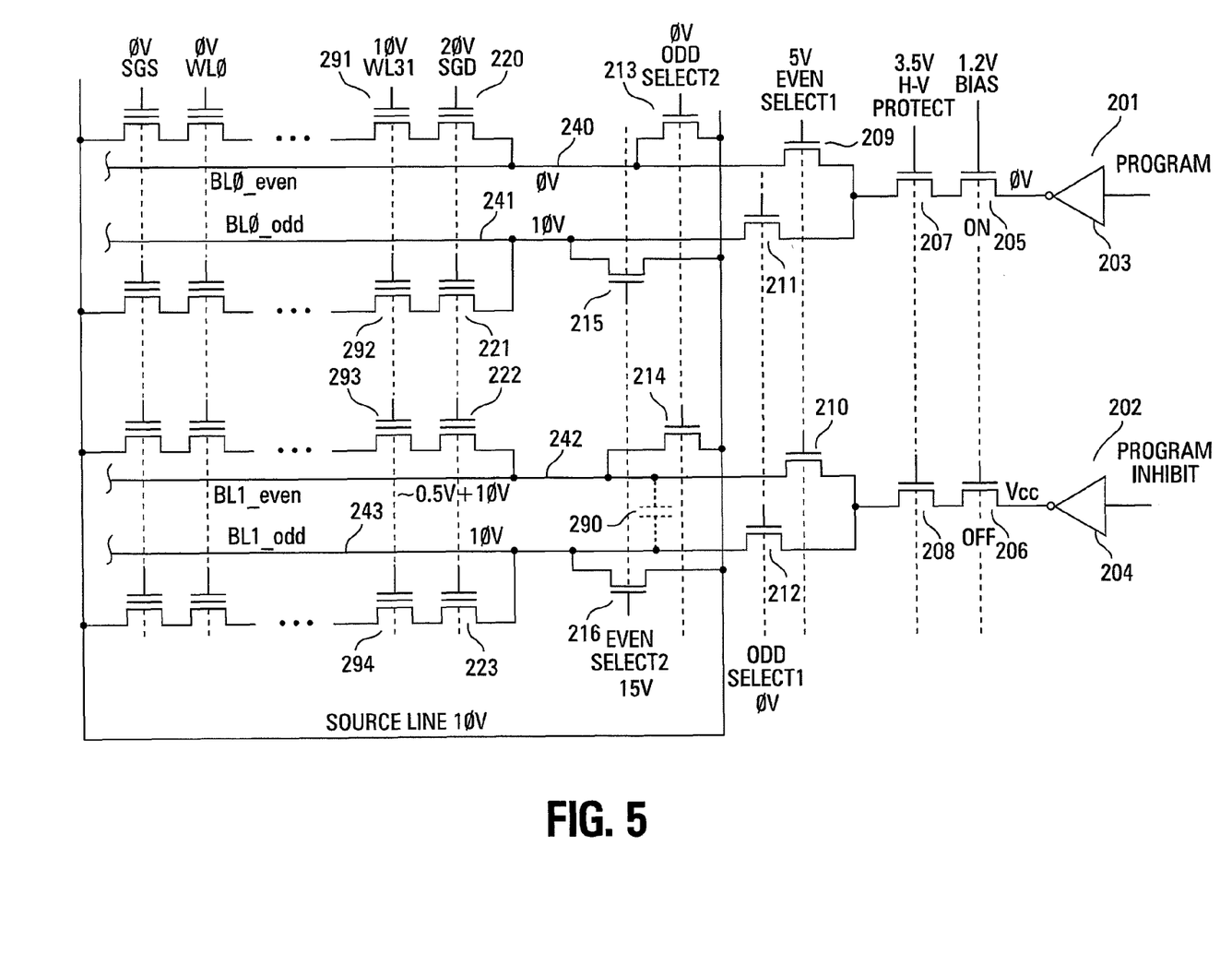
FIG. 5 shows a schematic diagram of one embodiment of a programming step of the method for programming select gate drain transistors.

In the embodiment of FIG. 2, as well as those of FIGS. 3-5, it is assumed that a programming operation of the SGD transistors of a particular block or other grouping of memory cells is already in progress and that at least one SGD transistor 222 has passed program verify. Further programming of this transistor 222 should be inhibited since any further programming pulses on the common control gate will over-program that particular transistor 222. It is further assumed that another SGD transistor 220 has not yet passed program verify and further programming pulses are needed for the transistor 220 to reach its desired threshold voltage. Thus, bit line circuit BL1 202, to which the programmed SGD transistor 222 is coupled, is to be program inhibited. Bit line circuit BL0 201, to which unprogrammed SGD transistor 220 is coupled, is being programmed. More specifically, the even bit line BL0_even 242 is to be program inhibited while BL0_even 240 is being programmed. Bit lines BL1_odd 241 and BL0_odd 243 are unselected and will not be affected by further programming pulses.

Referring to FIG. 2, the program inhibit includes biasing the bit line circuit 202 to be program inhibited at a supply voltage ($V_{CC}$). A voltage of 1.2V is applied to the control gates of the BIAS transistors 205, 206 and a voltage of 3.5V is applied to the control gates of the HV PROTECT transistors 207, 208. Since BL1_even 242 is coupled to the EVEN SELECT1 transistor 210 that is turned on with a control gate voltage of 5V and the BL1 BIAS transistor 206 is turned off (i.e., $V_{CC}$ is on the source of the BIAS transistor 206), the BL1_even 242 bit line is pulled up to approximately 0.5V (1.2V (BIAS)−$V_{th}$ (BIAS)).

The EVEN SELECT2 transistors 215, 216 are also turned on with 5V on their control gates. Since these transistors 215, 216 are coupled to the source line 250 that is at 0V, the BL0_odd bit line 241 and the BL1_odd bit line 243 are pulled to ground. The BL0_even bit line 240 is also at 0V due to the 0V at the output of the bit line driver 203.

The SGD transistors 220-223, at this step, are not yet being programmed. Thus, the control gates of the SGD transistors 220-223 are at 0V. The SGS transistor 224-227 control gates and the word lines WL0-WL31 of the memory block or other grouping of memory cells are also at 0V.

FIG. 3 illustrates a schematic diagram of one embodiment of a second step in the method for programming the SGD transistor. In this step, the source line voltage is increased from 0V to a voltage that is greater than 0V (e.g., $V_{CC}$).

The output of the bit line driver 204 for the inhibited bit line circuit 202 is still at $V_{CC}$ so that the BIAS transistor 206 is turned off. The output of the bit line driver 203 for the bit line circuit 201 to be programmed is still at 0V so that the BIAS transistor 205 of that bit line circuit 201 is turned on. The HV PROTECT transistors 207, 208, the EVEN SELECT1 transistors 209, 210 and the EVEN SELECT2 transistors 215, 216 are still turned on. The ODD SELECT1 transistors 211, 212 and the ODD SELECT2 transistors 213, 214 are still turned off.

The BL0_odd bit line 241 is pulled up to the source line voltage (e.g., $V_{CC}$) by the EVEN SELECT2 transistor 215 that is coupled to the source line that is at the voltage greater than 0V (e.g., $V_{CC}$). Similarly, the BL1_odd bit line 243 is pulled up to $V_{CC}$ by the EVEN SELECT2 transistor 216 that is coupled to the source line. A coupling capacitance 290 can pull up the inhibited bit line BL1_even 242 so that it is at approximately 0.5V+$V_{CC}$. BL0_even 240 is still at 0V.

FIG. 4 illustrates a schematic diagram of one embodiment of a third step in the method for programming the SGD transistor. In this step, the source line voltage is again increased. This step increases the source line voltage from $V_{CC}$ to a voltage that is greater than $V_{CC}$ (e.g., 10V).

The output of the bit line driver 204 for the inhibited bit line circuit 202 is still at $V_{CC}$ so that the BIAS transistor 206 is turned off. The output of the bit line driver 203 for the bit line circuit 201 to be programmed is still at 0V so that the BIAS transistor 205 of that bit line circuit 201 is turned on. The HV PROTECT transistors 207, 208 and the EVEN SELECT1 transistors 209, 210 are still turned on. The ODD SELECT1 transistors 211, 212 and the ODD SELECT2 transistors 213, 214 are still turned off.

The EVEN SELECT2 transistors 215, 216 are turned on with a voltage that is increased from the previous steps. The control gates of the EVEN SELECT2 transistors 215, 216 should be biased at a voltage greater than the voltage level of the source line plus the threshold voltage of the EVEN SELECT2 transistors 215, 216 (e.g., 5V). In one embodiment, the previous two steps biased the control gates of the EVEN SELECT2 transistors 215, 216 at 5V that, in one embodiment, is the threshold voltage of the EVEN SELECT2 transistors 215, 216. This step increases the control gate voltage to, for example, 15V ($V_{sourceline}+V_{th}$).

Bit line BL0_even 240 is at 0V since the ODD SELECT2 transistor 213 is turned off. The BL0_odd and BL1_odd bit lines 241, 243 are pulled up to the source line voltage (e.g., 10V) by the EVEN SELECT2 transistors 215, 216 being coupled to the source line. Bit line BL1_even 242 is pulled up to approximately 0.5V+$V_{sourceline}$ (e.g., 10V) by the coupling capacitance 290 between the even and odd BL1 bit lines 242, 243.

FIG. 5 illustrates a schematic diagram of one embodiment of the programming step in the method for continuing programming of the SGD transistor 220. Even though this figure only shows one SGD transistor 220 being biased for programming, alternate embodiments might include program biasing of other unprogrammed SGD transistors of the memory block or other grouping of memory cells.

The embodiment of FIG. 5 includes substantially the same biasing as in the previous step. The output of the bit line driver 204 for the inhibited bit line circuit 202 is still at $V_{CC}$ so that the BIAS transistor 206 is turned off. The output of the bit line driver 203 for the bit line circuit 201 to be programmed is still at 0V so that the BIAS transistor 205 of that bit line circuit 201 is turned on. The HV PROTECT transistors 207, 208 and the EVEN SELECT1 transistors 209, 210 are still turned on. The ODD SELECT1 transistors 211, 212 and the ODD SELECT2 transistors 213, 214 are still turned off.

The EVEN SELECT2 transistors 215, 216 are turned on with a voltage greater than the voltage level of the source line ($V_{sourceline}$) plus the threshold voltage ($V_{th}$) of the EVEN SELECT2 transistors 215, 216 (e.g., 5V). In one embodiment, $V_{sourceline}+V_{th}=10.5V$.

Bit line BL0_even 240 is at 0V since the ODD SELECT2 transistor 213 is turned off. The BL0_odd and BL1_odd bit lines 241, 243 are pulled up to the source line voltage (e.g., 10V) by the EVEN SELECT2 transistors 215, 216 being coupled to the source line. Bit line BL1_even 242 is pulled up to approximately 0.5V+$V_{sourceline}$ (e.g., 10V) by the coupling capacitance 290 between the even and odd BL1 bit lines 242, 243.

For additional programming of the uninhibited SGD transistor 220, programming pulses are applied to the common control gate of the SGD transistors 220-223. After each program pulse, a program verify operation determines if the SGD transistor 220 being programmed has reached the target threshold voltage. If the program verify operation fails, another program pulse is applied that is larger than the previous programming pulse voltage by a step voltage (e.g., 1V). These programming pulses can start at some initial program voltage (e.g., 16V) and increase by the step voltage to a maximum program voltage (e.g., 20V). Since the remaining SGD transistors 221-223 of the embodiment of FIG. 5 are inhibited, the programming pulses will have no substantial effect on their already programmed threshold voltages.

In order to protect memory cells adjacent to the SGD transistors 220-223 from a break-down condition that could damage the tunnel oxide between the floating gate and the substrate, a maximum word line-to-word line threshold voltage (e.g., 10V) should be observed. Thus, in the illustrated embodiment, the WL31 word line 291 adjacent to the SGD transistors 220-223 is biased at 10V. This voltage is less than a voltage that would program the memory cells of the WL31 word line but is large enough to reduce the word line-to-word line difference to a maximum of 10V.

The high voltage (e.g., 10V) of the source line for the above-described method for programming can, in one embodiment, be generated by a charge pump. Since the unprogrammed total capacitance of a large number of bit lines can be very large, a typical charge pump may not be able to provide the current for programming. However, as programming pulses are applied to the SGD common control gate, some of the SGD transistors will become programmed to the target threshold voltage. If only a portion of the SGD transistors (e.g., 90%) become programmed to the target threshold voltage, the total capacitance of the bit lines becomes significantly smaller since bit line-to-bit line capacitance dominates total bit line capacitance.

The embodiment of FIG. 5 isolates unprogrammed SGD transistors during the programming pulses by inhibiting already programmed SGD transistors. This effectively reduces the bit line-to-bit line capacitance so that a typical charge pump can provide the desired current to perform the programming.

Figure 6:
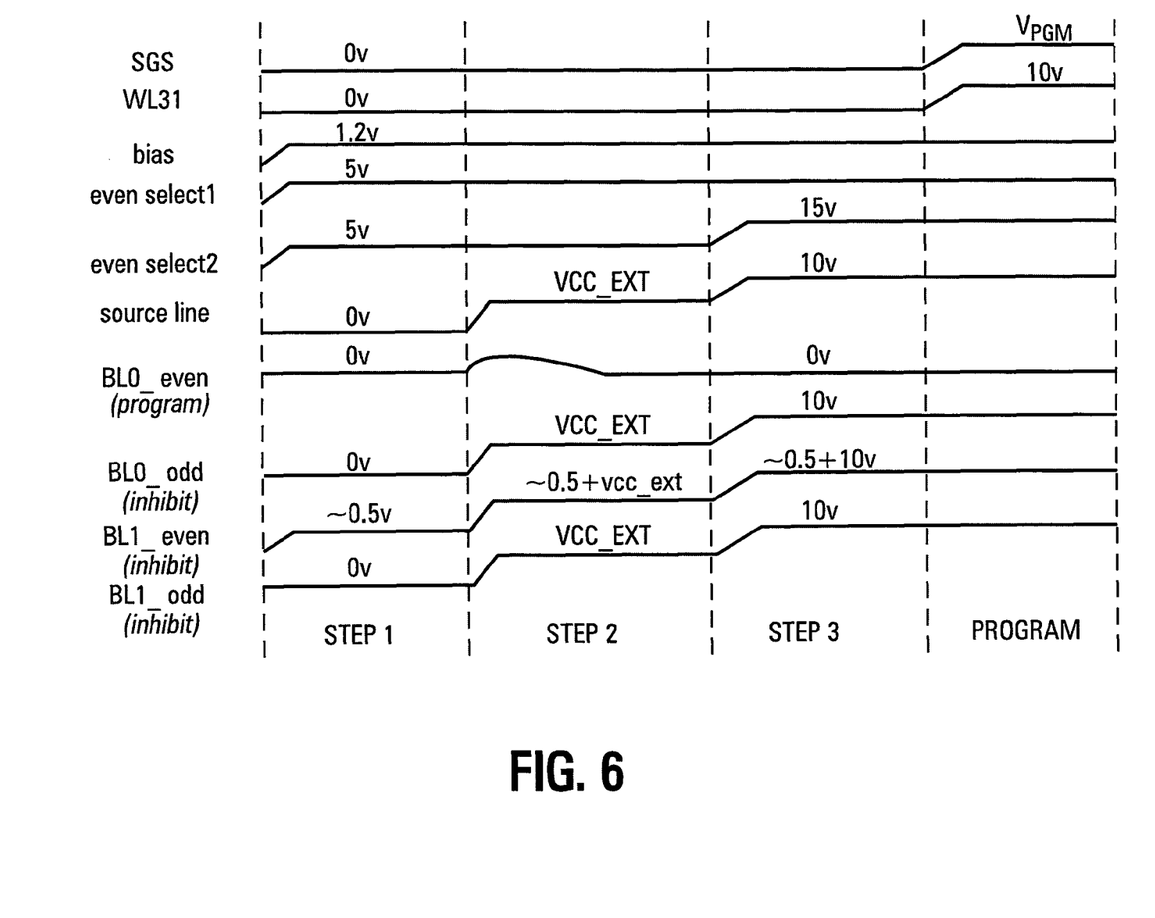
FIG. 6 shows a timing diagram of one embodiment of the method for programming select gate drain transistors in accordance with the embodiments of FIGS. 2-5.

FIG. 6 illustrates a timing diagram in accordance with the embodiments of FIGS. 2-5. This diagram shows the state of the signals during each step of the method for programming at least one SGD transistor. The voltages illustrated are only one example. Alternate embodiments may use different voltages that produce the same result.

Step 1 refers to the embodiment of FIG. 2. This step shows that the EVEN SELECT1 and EVEN SELECT2 transistors are turned on while the source line is at 0V and the selected, inhibited bit line BL1_even is pulled up to an initial voltage (e.g., approximately 0.5V) that is the threshold voltage of the BIAS transistor. The unselected bit lines (e.g., BL0_odd, BL1_odd) are at 0V.

Step 2 refers to the embodiment of FIG. 3. This step shows that the source line voltage has increased from 0V to the supply voltage (e.g., $V_{CC}$). The EVEN SELECT1 and EVEN SELECT2 transistors are still at the same voltage as the first step. The selected, inhibited bit line BL1_even is pulled up from the initial voltage to the initial voltage plus the source line voltage (e.g., approximately 0.5V+$V_{CC}$). The unselected, inhibited bit lines BL0_odd and BL1_odd are pulled up to the source line voltage (e.g., $V_{CC}$).

Step 3 refers to the embodiment of FIG. 4. This step shows that the source line is now at a voltage (e.g., 10V) that is higher than the previous step's voltage. To allow this higher voltage to pass, the EVEN SELECT2 voltage is increased as well to a voltage that is substantially equal to the EVEN SELECT2 transistor threshold voltage plus the source line voltage (e.g., $V_{th}+V_{sourceline}$). The selected, inhibited bit line BL1_even is pulled up from the initial voltage to the initial voltage plus the present source line voltage (e.g., approximately $0.5V+V_{sourceline}$). The unselected, inhibited bit lines BL0_odd and BL1_odd are pulled up to $V_{sourceline}$.

The PROGRAM step refers to the embodiment of FIG. 5. This step shows that the inhibit biasing of the previous step is still active while the programming pulses, at $V_{PGM}$ are applied to the SGD transistor or transistors to be programmed. The adjacent word line WL31 is biased at a particular voltage that reduces the word line-to-word line voltage difference (e.g., 10V).

Figure 7:
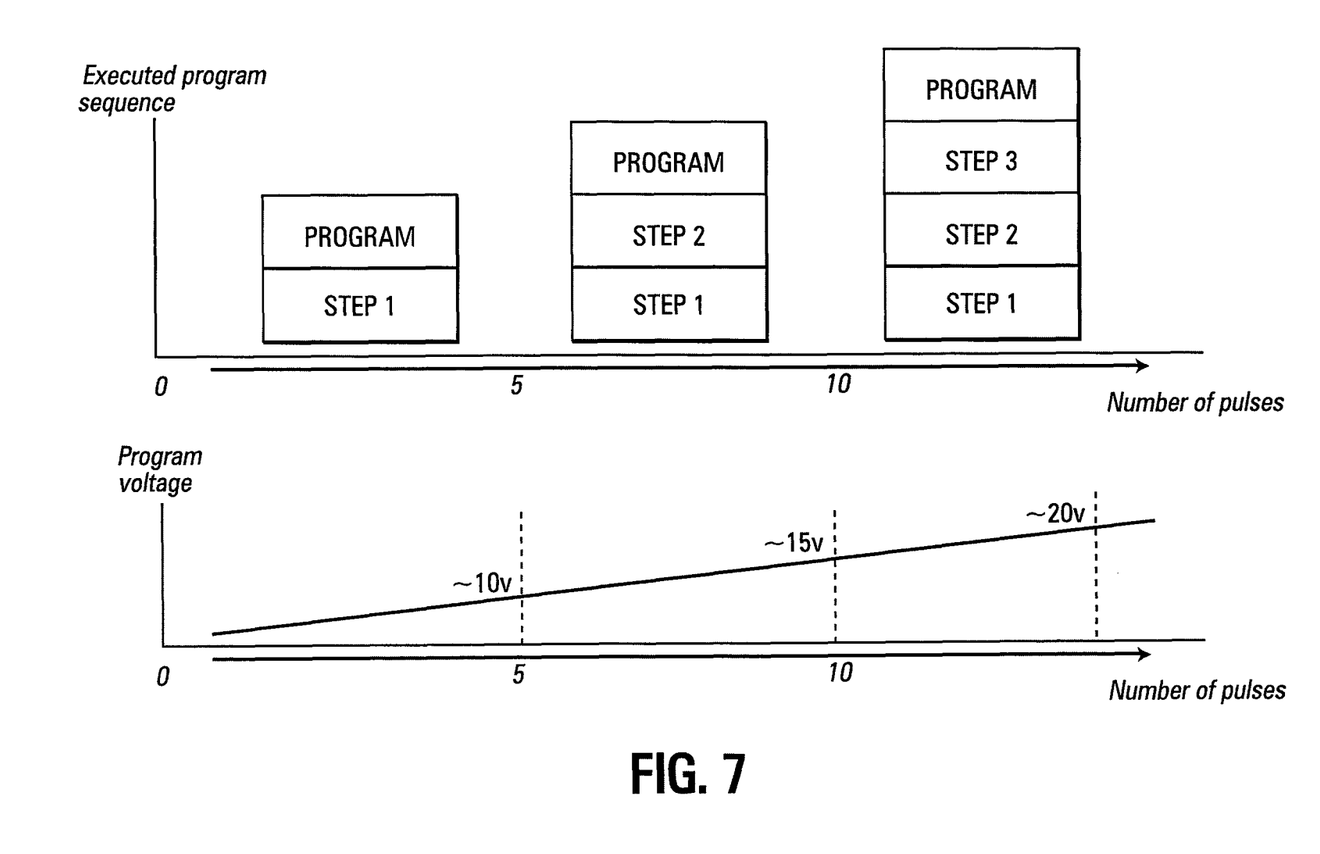
FIG. 7 shows a diagram illustrating the relationship between a quantity of programming pulses and the number of executed steps of the present embodiments.

Not all of the steps of the method for programming of FIGS. 2-5 would be used for different embodiments. FIG. 7 illustrates examples of when each of the different steps might be used. Generally, when the number of programming pulses is small, the inhibit voltage is low and the inhibit voltage is increased as the umber of program pulses increases. Not all of the programming steps, with increasing inhibit voltage, would be used for all embodiments.

The lower plot shows the number of programming pulses versus the program voltage of each pulse. It can be seen that as the number of pulses increases, so does the programming voltage. For example, at five programming pulses the voltage might be approximately 10V and at ten programming pulses the voltage might be approximately 15V.

The upper plot of FIG. 7 shows the number of programming pulses versus the executed program sequence of the programming steps illustrated in FIGS. 2-5. For less than five programming pulses, only step 1 and the programming step might be executed. Between five and ten programming pulses, only steps 1 and 2 and the programming step might be executed. Between ten and twenty programming pulses, all of the steps might be executed.

Figure 8:
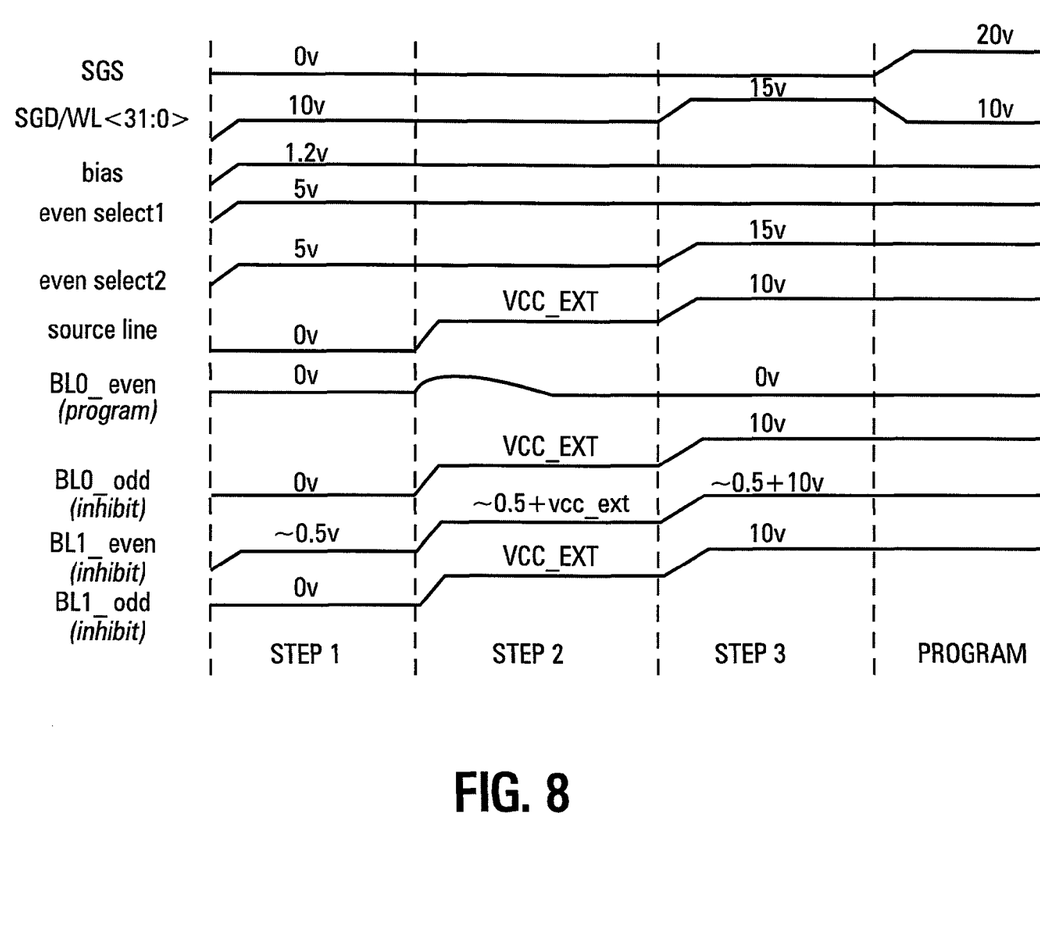
FIG. 8 shows a timing diagram of a method for programming select gate source transistors.

FIG. 8 illustrates a timing diagram of an embodiment for programming an SGS transistor. The programming steps are substantially similar to the steps for programming an SGD transistor. It can be seen that a difference between these two embodiments is that the word line and SGD voltages are increased enough such that the inhibit voltage is transferred all the way through the series string of memory cells to the SGS transistors.

For example, FIG. 8 shows that the SGD and all word lines WL<31:0> are initially at an initial voltage (e.g., 10V) for steps 1 and 2. At step 3, the word line voltage and the SGD voltage is increased to another voltage (e.g., 15V). When the actual programming pulses start during the PROGRAM step, the word line voltage and SGD voltage are reduced to a lower voltage (e.g., 10V). These voltages are lowered so as not to disturb the memory cells of the series string during the programming of the SGS transistors.

Figure 9:
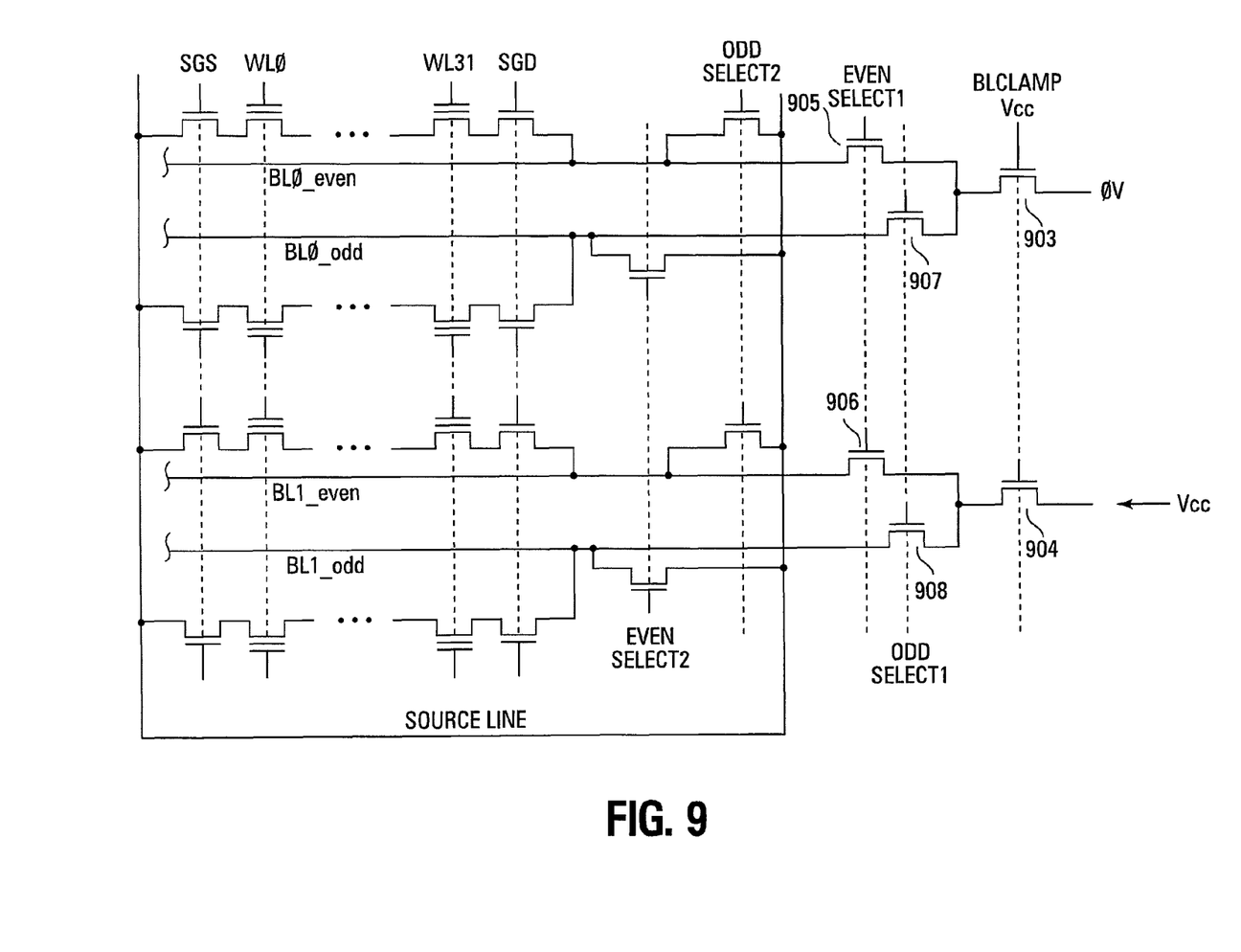
FIG. 9 shows an alternate embodiment using a bit line clamp voltage for controlling voltage access to a memory cell.

FIG. 9 illustrates an alternate embodiment for controlling access of voltages from sense circuitry (e.g., sense amplifier) to the memory cell. In the above embodiments of FIGS. 2-5, the BIAS transistors 205, 206, HV PROTECT transistors 207, 208, and EVEN/ODD SELECT1 transistors 209-212 form a transistor chain that passes a voltage from the sense amplifier to the selected memory cell. One of the signals controlling these transistors should be low enough to prevent the sense amplifier from passing a high voltage to the selected memory cell while also high enough to pass 0V to the selected memory cell. The other two signals controlling these transistors can be driven to voltages that are simply high enough to pass the 0V and do not need to be controlled. The above embodiments control either the EVEN/ODD SELECT1 transistors or the HV PROTECT transistors.

FIG. 9 illustrates another embodiment where the BLCLAMP transistors 903, 904 and the EVEN/ODD SELECT1 transistors 905-908 form the same kind of transistor chain. In this embodiment, the voltage access to the selected memory cell is controlled by the BLCLAMP transistors being driven by $V_{CC}$. $V_{CC}$ satisfies the criteria of being both low enough to prevent the sense amplifier from passing a high voltage to the selected memory cell while also high enough to pass 0V.

Figure 10:
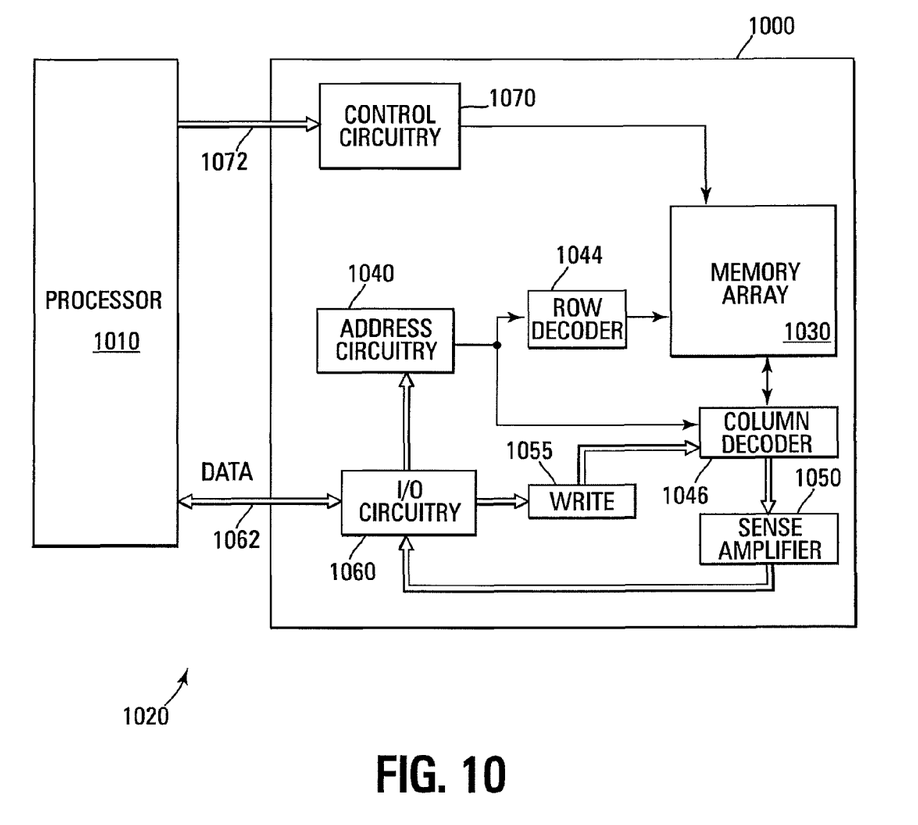
FIG. 10 shows a block diagram of one embodiment of a memory system that can incorporate the select gate programming of the embodiments of FIGS. 7 and 8.

FIG. 10 illustrates a functional block diagram of a memory device 1000. The memory device 1000 is coupled to an external processor 1010. The processor 1010 may be a microprocessor or some other type of controller. The memory device 1000 and the processor 1010 form part of a memory system 1020. The memory device 1000 has been simplified to focus on features of the memory that are helpful in understanding the present invention.

The memory device 1000 includes an array 1030 of non-volatile memory cells. The memory array 1030 is arranged in banks of word line rows and bit line columns. In one embodiment, the columns of the memory array 1030 are comprised of series strings of memory cells. As is well known in the art, the connections of the cells to the bit lines determines whether the array is a NAND architecture, an AND architecture, or a NOR architecture.

Address buffer circuitry 1040 is provided to latch address signals provided through I/O circuitry 1060. Address signals are received and decoded by a row decoder 1044 and a column decoder 1046 to access the memory array 1030. It will be appreciated by those skilled in the art, with the benefit of the present description, that the number of address input connections depends on the density and architecture of the memory array 1030. That is, the number of addresses increases with both increased memory cell counts and increased bank and block counts.

The memory device 1000 reads data in the memory array 1030 by sensing voltage or current changes in the memory array columns using sense amplifier circuitry 1050. The sense amplifier circuitry 1050, in one embodiment, is coupled to read and latch a row of data from the memory array 1030. Data input and output buffer circuitry 1060 is included for bidirectional data communication as well as the address communication over a plurality of data connections 1062 with the controller 1010. Write circuitry 1055 is provided to write data to the memory array.

Memory control circuitry 1070 decodes signals provided on control connections 1072 from the processor 1010. These signals are used to control the operations on the memory array 1030, including data read, data write (program), and erase operations. The memory control circuitry 1070 may be a state machine, a sequencer, or some other type of controller to generate the memory control signals. In one embodiment, the memory control circuitry 1070 is configured to execute the SGD/SGS programming embodiments of the memory device as described previously.

The flash memory device illustrated in FIG. 10 has been simplified to facilitate a basic understanding of the features of the memory. A more detailed understanding of internal circuitry and functions of flash memories are known to those skilled in the art.

CONCLUSION

In summary, one or more embodiments of the method for programming select gate transistors use a program inhibit to already programmed select gate transistors that provides for a more narrow threshold voltage distribution. These embodiments use bit line-to-bit line capacitance of adjacent bit lines to boost the bit line voltage of the inhibited bit lines to the target inhibit voltage. Additionally, by monitoring the number of program pulses applied to the select gate transistors, execution of selected ones of the inhibit steps can be accomplished without overworking the charge pump that generates the inhibit voltage.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming select gate transistors, a different select gate transistor coupled to each end of a series string of memory cells, the method comprising:
    controlling an inhibit voltage on a data line coupled to a programmed select gate transistor; and
    applying a program voltage to a control gate of an unprogrammed select gate transistor wherein, once programmed, the select gate transistor is configured to control access to its respective series string of memory cells; and
    increasing the inhibit voltage by capacitive coupling between the data line and at least one other data line.

2. The method of claim 1 wherein the program voltage comprises a plurality of program pulses having an incrementally increasing program voltage.

3. A method for programming select gate transistors, a different select gate transistor coupled to each end of a series string of memory cells, the method comprising:
    controlling an inhibit voltage on a data line coupled to a programmed select gate transistor; and
    applying a program voltage to a control gate of an unprogrammed select gate transistor wherein, once programmed, the select gate transistor is configured to control access to its respective series string of memory cells;
    wherein the program voltage comprises a plurality of program pulses having an incrementally increasing program voltage; and
    wherein the inhibit voltage is determined in response to a quantity of program pulses.

4. A method for programming select gate transistors, a different select gate transistor coupled to each end of a series string of memory cells, the method comprising:
    controlling an inhibit voltage on a data line coupled to a programmed select gate transistor; and
    applying a program voltage to a control gate of an unprogrammed select gate transistor wherein, once programmed, the select gate transistor is configured to control access to its respective series string of memory cells;
    wherein controlling the inhibit voltage further comprises controlling such that the inhibit voltage is both low enough to prevent a first voltage to a selected memory cell and high enough to allow a second voltage to the selected memory cell, such that the first voltage is greater than the second voltage.

5. The method of claim 4 wherein the second voltage is 0V.

6. The method of claim 4 wherein the inhibit voltage is a supply voltage.

7. A method for programming a select gate transistor of a plurality of select gate transistors, each select gate transistor coupled to a different end of a respective series string of memory cells, the method comprising:
    applying a first voltage to a data line coupled to a select gate transistor, of the plurality of select gate transistors, to be program inhibited;
    increasing the first voltage to a second voltage that is greater than the first voltage by capacitive coupling with an adjacent data line; and
    applying programming pulses to the select gate transistor to be programmed wherein, once programmed, the select gate transistor is configured to control access to its respective series string of memory cells.

8. The method of claim 7 wherein the select gate transistor is a select gate drain transistor.

9. The method of claim 7 wherein the plurality of select gate transistors are part of a memory block.

10. The method of claim 7 wherein the first voltage is a control gate voltage applied to a bias transistor, coupled to the data line, minus a threshold voltage of the bias transistor.

11. The method of claim 7 and further comprising increasing the second voltage to a third voltage, that is greater than the second voltage, by capacitive coupling with the adjacent data line.

12. The method of claim 7 wherein the first voltage is substantially equal to a control gate voltage applied to a bias transistor, coupled to the data line, minus a threshold voltage of the bias transistor plus a supply voltage, wherein the supply voltage is a result of the capacitive coupling with the adjacent data line that is biased at the supply voltage.

13. The method of claim 7 and further comprising increasing the second voltage to a third voltage, greater than the second voltage, in response to a quantity of programming pulses applied to the select gate transistor to be programmed.

14. The method of claim 7 wherein the adjacent data line is an unselected data line.

15. The method of claim 7 and further comprising applying 0V to a data line coupled to the select gate transistor to be programmed.

16. A memory device comprising:
    a plurality of series strings of memory cells, each series string having a select gate transistor at each end;
    a plurality of data lines, each data line coupled to a different series string of memory cells through one of the select gate transistors; and
    a source line coupled to each of the series strings of memory cells through another one of the select gate transistors;
    wherein data lines coupled to select gate transistors to be program inhibited are configured to be biased at a voltage corresponding to a voltage provided by the source line.

17. The memory device of claim 16 and further comprising a series connection of transistors that enable access of a voltage to a memory cell.

18. A memory device comprising:
    a plurality of series strings of memory cells, each series string having a select gate transistor at each end;
    a plurality of data lines, each data line coupled to a different series string of memory cells through one of the select gate transistors; and
    a source line coupled to each of the series strings of memory cells through another one of the select gate transistors;

wherein data lines coupled to select gate transistors to be program inhibited are configured to be biased at a voltage corresponding to a voltage provided by the source line; and wherein the source line is coupled to each of the plurality of data lines through a biasing transistor.

19. The memory device of claim 18 wherein the biasing transistor is coupled to an unselected data line to pull up the unselected data line in response to a bias voltage.

20. The memory device of claim 19 and further including a capacitive coupling between the selected data line and an adjacent unselected data line wherein a voltage on the selected data lines that are program inhibited is increased to a program inhibit voltage.

21. A memory device comprising:
a plurality of series strings of memory cells, each series string having a select gate transistor at each end;
a plurality of data lines, each data line coupled to a different series string of memory cells through one of the select gate transistors;
a source line coupled to each of the series strings of memory cells through another one of the select gate transistors; and
a series connection of transistors that enable access of a voltage to a memory cell;
wherein data lines coupled to select gate transistors to be program inhibited are configured to be biased at a voltage corresponding to a voltage provided by the source line; and
wherein the series connection of transistors comprises:
a bias transistor for applying an initial voltage on a data line;
a high voltage protection transistor coupled to the bias transistor for providing voltage protection to the data line; and
a select transistor coupled between the high voltage protection transistor and the data line for selectively providing access to the data line;
wherein a voltage on a control gate of the select transistor is controlled to provide access to the data line while the bias transistor and the high voltage protection transistor have control gate voltages that are only high enough to turn on their respective transistors.

22. A memory device comprising:
a plurality of series strings of memory cells, each series string having a select gate transistor at each end;
a plurality of data lines, each data line coupled to a different series string of memory cells through one of the select gate transistors;
a source line coupled to each of the series strings of memory cells through another one of the select gate transistors; and
a series connection of transistors that enable access of a voltage to a memory cell;
wherein data lines coupled to select gate transistors to be program inhibited are configured to be biased at a voltage corresponding to a voltage provided by the source line; and
wherein the series connection of transistors comprises:
a bit line clamping transistor for applying an initial voltage on a data line; and
a select transistor coupled between the bit line clamping transistor and the data line;
wherein a voltage on control gate of the bit line clamping transistor is controlled to be a supply voltage while a voltage on a control gate of the select transistor is only high enough to turn on the select transistor.

23. A memory device comprising:
a plurality of series strings of memory cells, each series string having a select gate transistor at each end;
a plurality of data lines, each data line coupled to a different series string of memory cells through one of the select gate transistors; and
a source line coupled to each of the series strings of memory cells through another one of the select gate transistors;
wherein data lines coupled to select gate transistors to be program inhibited are configured to be biased at a voltage corresponding to a voltage provided by the source line; and
wherein the voltage provided by the source line is increased for each step of a plurality of program inhibit steps wherein each different voltage is used to program inhibit programmed select gate transistors after a particular quantity of program pulses.

24. A memory device comprising:
a memory array organized in series strings of memory cells, each of the strings having a select gate drain transistor coupled to a data line and a select gate source transistor coupled to a source line; and
memory control circuitry coupled to the memory array for controlling operation of the memory array, the memory control circuitry configured to control programming of unprogrammed select gate drain transistors and/or unprogrammed select gate source transistors by selecting one of a plurality of inhibit voltages to be applied to each data line coupled to a programmed select gate drain transistor or a programmed select gate source transistor to be program inhibited;
wherein the memory control circuitry is configured to select the one of the plurality of inhibit voltages in response to a number of program pulses applied to the unprogrammed select gate drain transistors and/or the unprogrammed select gate source transistors during programming.

25. A memory device comprising:
a memory array organized in series strings of memory cells, each of the strings having a select gate drain transistor coupled to a data line and a select gate source transistor coupled to a source line; and
memory control circuitry coupled to the memory array for controlling operation of the memory array, the memory control circuitry configured to control programming of the select gate drain transistors and/or the select gate source transistors by selecting one of a plurality of inhibit voltages to be applied to each data line coupled to a select gate drain or a select gate source transistor to be program inhibited;
wherein the memory control circuitry is further configured to control application of the selected inhibit voltage to a selected data line by control of a bias transistor coupled to an unselected data line adjacent to the selected data line such that the bias transistor transfers a voltage from the source line to the unselected data line that is capacitively coupled to the adjacent selected data.

26. A memory device comprising:
a memory array organized in series strings of memory cells, each of the strings having a select gate drain transistor coupled to a data line and a select gate source transistor coupled to a source line; and
memory control circuitry coupled to the memory array for controlling operation of the memory array, the memory control circuitry configured to control programming of the select gate drain transistors and/or the select gate source transistors by selecting one of a plurality of inhibit voltages to be applied to each data line coupled to a select gate drain or a select gate source transistor to be program inhibited;

wherein the memory control circuitry is further configured to control programming of the select gate source transistors by increasing a voltage applied to both the select gate drain transistors and the memory cells prior to generation of a programming pulse on the select gate source transistors.

27. The memory device of claim 26 wherein the increased voltage applied to both the select gate drain transistors and the memory cells is reduced while the program pulse is generated.

28. A memory device comprising:
a memory array organized in series strings of memory cells, each of the strings having a select gate drain transistor coupled to a data line and a select gate source transistor coupled to a source line; and
memory control circuitry coupled to the memory array for controlling operation of the memory array, the memory control circuitry configured to control programming of the select gate drain transistors and/or the select gate source transistors by selecting one of a plurality of inhibit voltages to be applied to each data line coupled to a select gate drain or a select gate source transistor to be program inhibited;
wherein the memory control circuitry is further configured to select each of the plurality of inhibit voltages in sequence from a low inhibit voltage to a high inhibit voltage prior to generating a programming pulse while the high inhibit voltage is applied to each data line to be program inhibited.

29. A method comprising:
biasing, at a first voltage, a data line coupled to a select gate to be program inhibited; and
biasing a source line voltage at a second voltage, wherein a data line adjacent to the data line coupled to the select gate to be program inhibited is pulled up to the second voltage, and wherein the data line coupled to the select gate to be program inhibited is pulled up to an inhibit voltage responsive to the adjacent data line being pulled up to the second voltage.

30. The method of claim 29, wherein the inhibit voltage comprises one of a plurality of inhibit voltages, and further comprising:
increasing the source line voltage to a third voltage, wherein the third voltage is higher than the second voltage; and
increasing a bias voltage applied to a select transistor coupling the source line to the adjacent data line,
wherein the data line adjacent to the data line coupled to the select gate to be program inhibited is pulled up to the third voltage, and wherein the data line coupled to the select gate to be program inhibited is pulled up to another one of the plurality of inhibit voltages responsive to the adjacent data line being pulled up to the third voltage.

31. The method of claim 30, further comprising:
applying a programming pulse to a control gate of the select gate; and
biasing a control gate of a memory cell adjacent to the select gate at the third voltage.

32. The method of claim 30, further comprising biasing control gates of all memory cells in a string of memory cells coupled to the select gate at a fourth voltage.

33. The method of claim 32, further comprising:
applying a programming pulse to a control gate of the select gate; and
biasing the control gates of the memory cells at the third voltage.

* * * * *